(12) United States Patent
Hockett

(10) Patent No.: US 6,885,564 B2
(45) Date of Patent: Apr. 26, 2005

(54) ELECTRONICS BOX HAVING INTERNAL CIRCUIT CARDS INTERCONNECTED TO EXTERNAL CONNECTORS SANS MOTHERBOARD

(75) Inventor: John E. Hockett, Glendale, AZ (US)

(73) Assignee: Honeywell International Inc., Morristown, NJ (US)

( * ) Notice: Subject to any disclaimer, the term of this patent is extended or adjusted under 35 U.S.C. 154(b) by 226 days.

(21) Appl. No.: 10/365,036

(22) Filed: Feb. 11, 2003

(65) Prior Publication Data

US 2004/0156179 A1 Aug. 12, 2004

(51) Int. Cl.[7] .......................... H05K 1/14; H01R 12/00
(52) U.S. Cl. ..................... 361/796; 361/752; 361/758; 361/770; 361/804; 361/803; 174/50
(58) Field of Search ................................ 361/796, 752, 361/736, 735, 728, 729, 730, 797, 683, 600, 758, 742, 804, 770, 803; 174/50; 211/41.17

(56) References Cited

U.S. PATENT DOCUMENTS

| | | | | |
|---|---|---|---|---|
| 3,755,630 A | * | 8/1973 | Boyer | 379/325 |
| 3,916,080 A | * | 10/1975 | Wakamatsu | 174/17.05 |
| 4,503,484 A | * | 3/1985 | Moxon | 361/736 |
| 4,658,375 A | * | 4/1987 | Onogi et al. | 710/2 |
| 4,953,058 A | * | 8/1990 | Harris | 361/690 |
| 5,093,759 A | | 3/1992 | Davis et al. | |
| 5,113,316 A | * | 5/1992 | Navarro et al. | 361/744 |
| 5,636,214 A | * | 6/1997 | Kranzler et al. | 370/438 |
| 5,740,378 A | * | 4/1998 | Rehl et al. | 710/302 |
| 5,805,596 A | * | 9/1998 | Kranzler et al. | 370/445 |
| 5,986,210 A | * | 11/1999 | Kummle et al. | 174/59 |
| 6,052,276 A | * | 4/2000 | Do et al. | 361/684 |
| 6,075,204 A | * | 6/2000 | Celauro et al. | 174/17 GF |
| 6,150,071 A | | 11/2000 | Harvey et al. | |
| 6,249,442 B1 | * | 6/2001 | Watanabe | 361/801 |
| 6,491,526 B2 | * | 12/2002 | Leman | 439/61 |
| 6,587,056 B1 | * | 7/2003 | Fraser et al. | 340/945 |
| 6,590,153 B1 | * | 7/2003 | Kohan | 174/35 C |
| 6,672,878 B2 | * | 1/2004 | Dean | 439/67 |

* cited by examiner

Primary Examiner—David Martin
Assistant Examiner—Dameon E. Levi

(57) ABSTRACT

An electronics chassis box includes a pair of opposing sidewalls, a pair of opposing end walls, a bottom surface, a top cover, and ring connectors assemblies mounted in selective ones of the walls of the electronic box. Boss members extend from the bottom surface at different heights upon which circuit cards are mounted in spatial relationship to each other. A flex interconnect substantially reduces and generally eliminates the need of a motherboard by interconnecting the circuit cards to one another and to external connectors mounted within the ring connector assemblies.

20 Claims, 4 Drawing Sheets

ELECTRONICS BOX HAVING INTERNAL CIRCUIT CARDS INTERCONNECTED TO EXTERNAL CONNECTORS SANS MOTHERBOARD

STATEMENT REGARDING FEDERALLY SPONSORED RESEARCH OR DEVELOPMENT

This invention was made with U.S. Government support under Contract No. NAS9-20000 awarded by the National Aeronautics and Space Administration (NASA). The government has certain rights in the invention.

FIELD OF THE INVENTION

The present invention relates to an electronics box for use in aviation and aerospace applications such as the Space Shuttle Orbiter, Space Station, or other spacecraft, and more particularly, to an electronic box for connecting and interconnecting circuit cards internal to the electronics box without requiring the use of a motherboard.

BACKGROUND OF THE INVENTION

The typical aerospace electronic chassis box generally consists of multiple plug-in circuit cards which plug into and are interconnected by a "motherboard". This motherboard must then be connected to the "outside world," in order to provide communication from the plug-in circuit boards to external electronics and vice versa, by either a wire harness or a flex cable harness. The harness is then connected to connectors, which are generally cylindrical and are mounted in the wall or walls of the electronic chassis box in a well known manner. (See U.S. Pat. No. 5,093,759 for a discussion of these types of prior art systems, which is hereby incorporated in its entirety by reference.)

The plug-in circuit cards typically rely on some type of chassis card guides formed within the electronic box structure to align the cards with a receptacle connector on the motherboard and to physically support them as well. Providing accurate alignment of the cards to the motherboards and simultaneously physically supporting the cards requires tight dimensioning and tolerances, sometimes accurately pinning the motherboard within the chassis. The card guides must be located accurately and yet must provide some card displacement in order to allow the cards to plug into the receptacle connectors on the motherboard. The necessary card displacement results in a compromise situation wherein the card guides are less effective in supporting the cards during shock and vibration as well as being less effective in providing heat sinking from the cards to the chassis than could otherwise be achieved with a solid mounting of the circuit cards.

In some arrangements, the circuit cards, which are mounted in individual card edge guides formed in the outer walls of the electronic box, are inserted into respective receptacle connectors in the motherboard, the latter of which may be positioned between the circuit cards and the bottom of the electronic box. Interposing the motherboard between the circuit cards and the bottom of the box results in limited heat transfer from the electronics because the only heat transfer occurs from the edges of the cards across the side wall of the box. It is generally desirable to transfer heat through a larger surface area, not just from the edges of the cards.

As previously mentioned, the method of connecting to the outside of the electronic chassis box is usually accomplished by a harness connected from the motherboard to external connectors situated in the wall of the chassis. In a digital application the harness may consist of hundreds of wires. Where a wire harness is impractical, a flex cable is sometimes used. However, the flex cable must either be made part of the motherboard (called a "rigid-flex"), or made to plug into the motherboard with another pair of connectors. This latter technique has generally proven costly and difficult to implement.

Another prior art system, in an attempt to minimize the amount of space within the box occupied by an interconnecting harness cable, utilizes an arrangement of in-line connectors. The in-line connectors are mounted adjacent to a motherboard with the in-line connectors interconnected with connectors mounted to the motherboard. Circuit card edge guides are still required for retaining circuit cards connected to the mother board.

The use of plug-in circuit cards creates other limitations in addition to those mentioned above. In most aerospace applications, and especially spacecraft electronics, plug-in cards create limitations on the thermal and vibration environments which cannot be exceeded if the cards are to survive.

Accordingly, in view of the above, it is desirable to overcome the problems and limitations of the prior art by reducing and preferably eliminating the need for motherboard and circuit card guides for the support and interconnection of circuit cards in an electronic chassis box.

BRIEF SUMMARY OF THE INVENTION

An electronic chassis box is provided that include a pair of opposing sidewalls, a pair of opposing end walls, a bottom surface, and a top cover. The electronic chassis box has boss members formed therein that extend from the bottom surface at respective heights to one another and circuit cards each attached to respective ones of the boss members such that the circuit cards are spatially related. Electrical connectors are mounted to at least one of the pair of opposing sidewalls and a flex interconnect is provided for interconnecting the circuit cards to one another and to the electrical connectors, respectively.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention.

Furthermore, there is no intention to be bound by any expressed or implied theory presented in the preceding background of the invention or the following detailed description of the invention.

Figure 1:
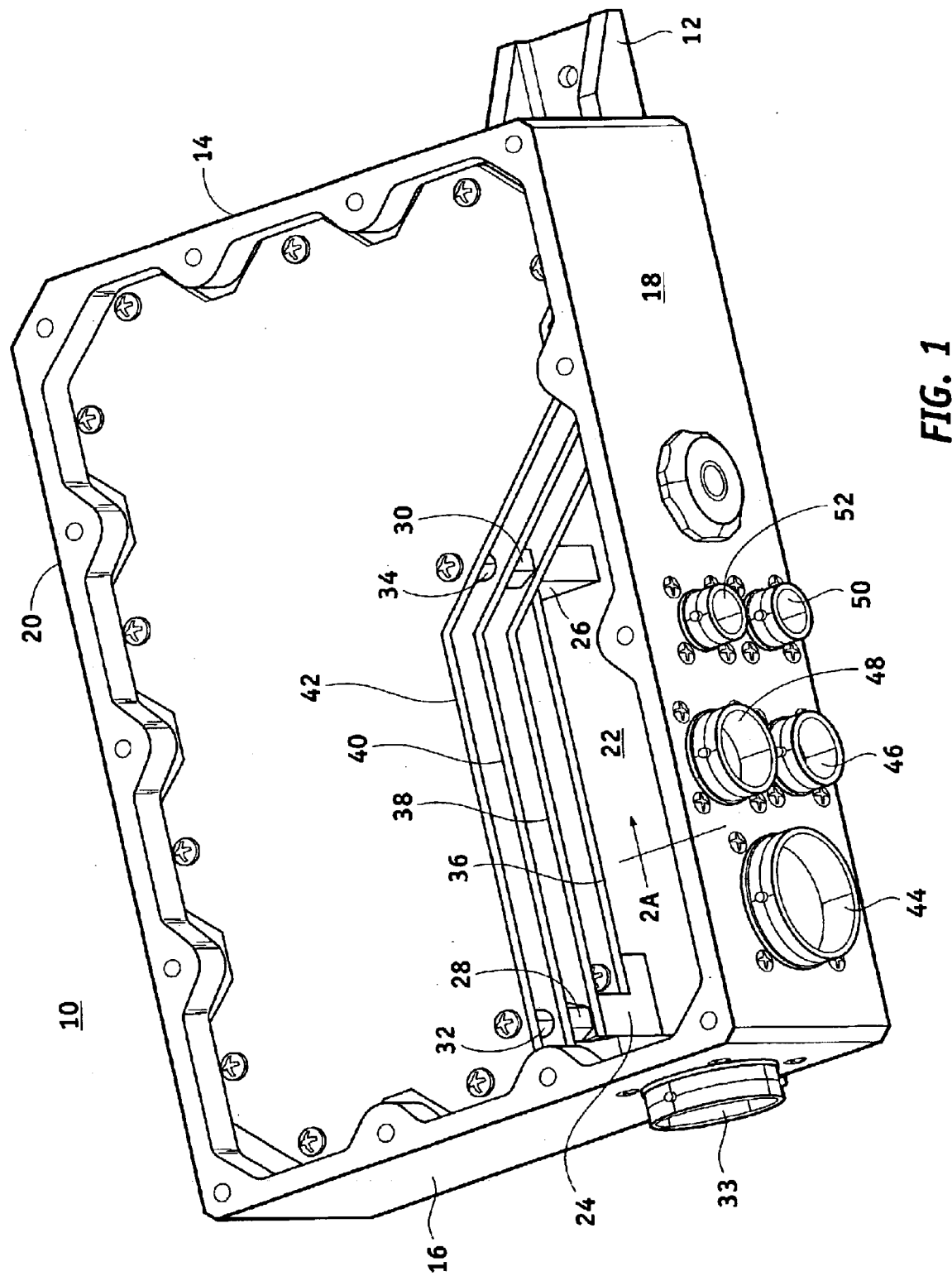
FIG. 1 is a perspective view illustrating an electronic chassis box showing the mounting of circuit cards in accordance with an embodiment of the present invention.

Referring to FIG. 1 a perspective view of an electronics chassis box 10 is provided that may, for example, be machined from aluminum block stock to the present dimensions. The box 10 includes a footpad 12 for mounting the box 10 to an intended external surface and includes a pair of opposing end walls (14,16) as well as a pair of opposing sidewalls (18,20). The electronic chassis box 10 also includes a bottom surface 22 having a plurality of boss like members and spacers (24,26,28,30,32,34) that support and separate a plurality of circuit cards. In accordance with a further embodiment to be subsequently illustrated and described in this detailed description of the invention, the box 10 may also include shelves formed therein to provide additional support to the circuit cards. The boss members and shelves can be formed in conventional manner during the machining process.

A plurality of removable circuit cards (36,38,40,42), which are shown without input/output connectors in this view, are formed to fit within the box 10 and are mounted to respective boss or spacer members, and optionally to shelves formed in the walls of the box, in a spatial relationship to one another using fasteners, such as screws or the like. As will be shown in more detail in the other drawings, the circuit cards each have an input/output connector associated therewith through which data in and data out is passed during operation thereof. The electronic chassis box 10 further includes apertures machined or otherwise appropriately formed through end wall 16 and sidewall 18 for accepting connector rings (33,44,46,48,50,52), respectively. The foregoing described connector rings hold external electrical connectors which are then mounted into the walls of the box 10 such that they communicate with the circuit cards during electronic operation in a well known manner. Furthermore, the box 10 also includes a top cover that can be attached to the box end walls and sidewalls, for example by fasteners such as screws or the like, but which is not shown for clarity sake in describing the present invention.

Figure 2:
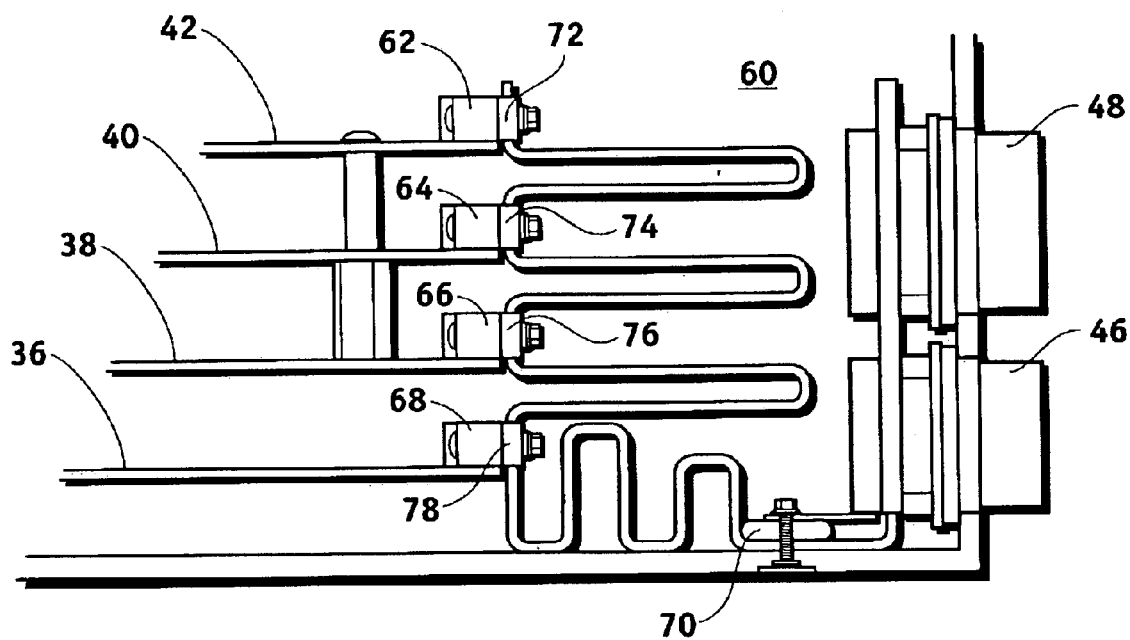
FIG. 2 is a sectional view illustrating a flex interconnect cable within the electronic chassis box in accordance with an embodiment of the present invention.
Figure 3:
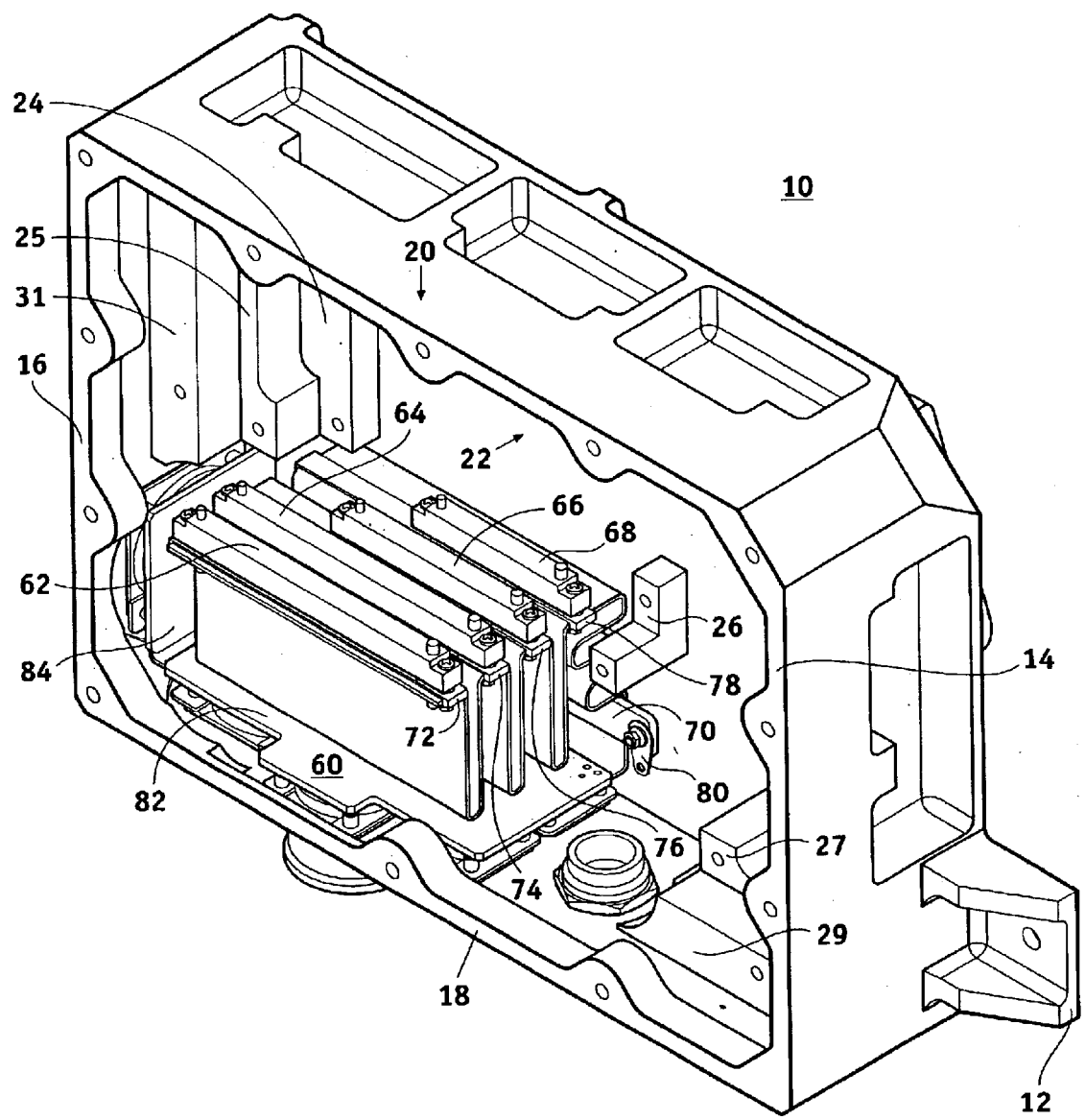
FIG. 3 is a further perspective view of the electronics box of FIG. 1 showing a flexible interconnect of one embodiment of the present invention absent the circuit cards.
Figure 4:
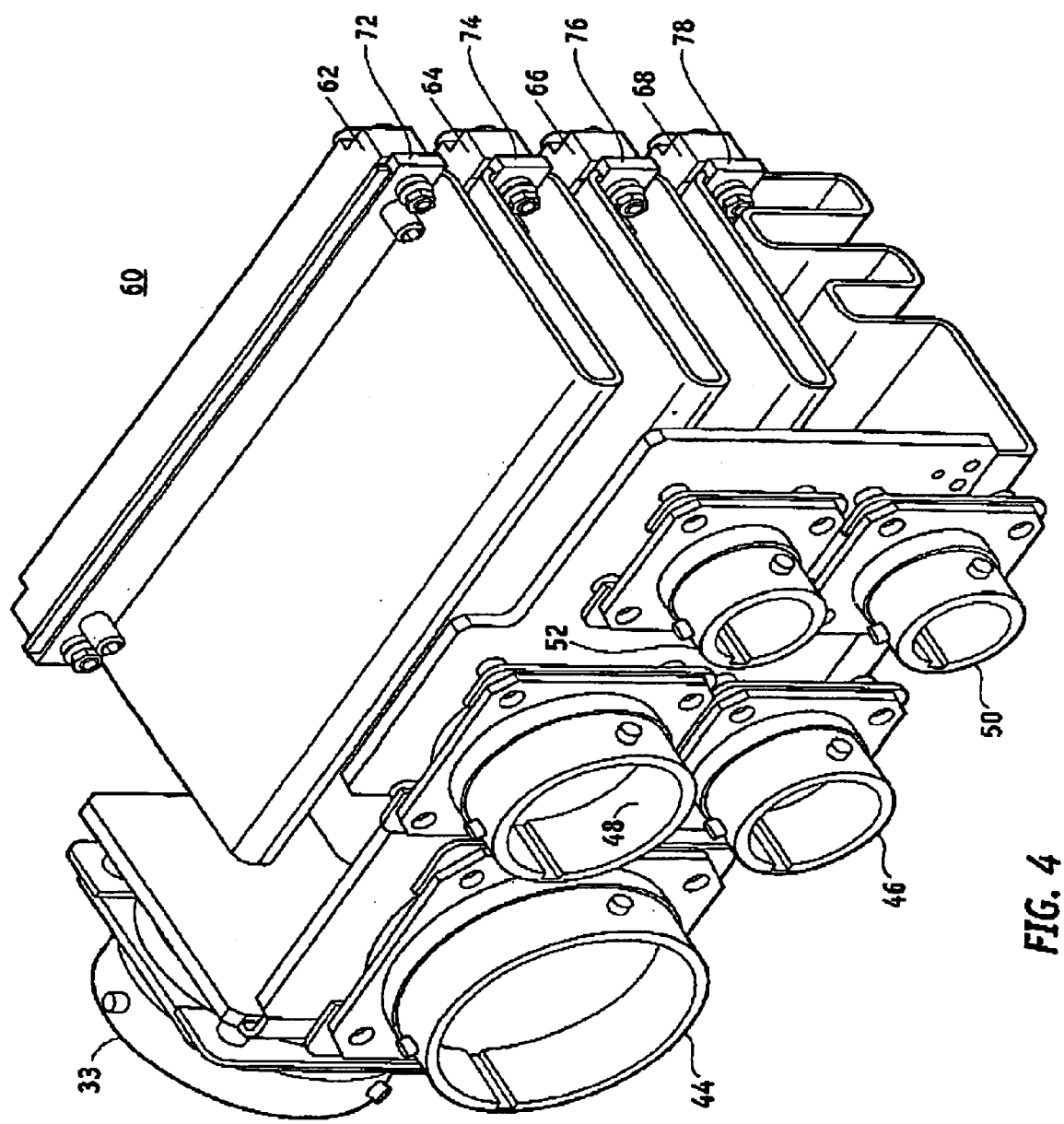
FIG. 4 is a perspective view that illustrates the flex interconnect of an embodiment of the present invention mounted between the internal connectors of the circuit cards and external connectors mounted in the walls of the electronic box (not shown).

FIGS. 2–4 illustrate a flex interconnect 60 in accordance with one embodiment of the invention. FIG. 2 illustrates, in a cut away end sectional view of box 10 in the direction of arrow 2A, the flex interconnect 60 in accordance with an embodiment of the present invention as well as the input/output connectors attached to the individual circuit cards. FIG. 3 illustrates the box 10 tipped forward with reference to FIG. 1 and with circuit cards (36,38,40,42) removed in order to more clearly show flex interconnect 60. FIG. 4 illustrates, in a perspective view, the flex interconnect in accordance with an embodiment of the invention mounted between the internal connections to the circuit cards and the external connectors mounted in the walls of the electronic chassis box (not shown). Flex interconnect cable 60 includes a plurality of connectors (72,74,76,78) spaced along its length. The connectors (72,74,76,78) connect respectively to input/output connectors (62,64,66,68) that are connected to respective circuit cards (42,40,38,36). In accordance with a typical convention, the connectors coupled to flex interconnect cable 60 are male connectors that couple to and mate with female input/output connectors attached to the circuit cards.

The flex interconnect 60 can be fabricated from numerous materials such as a Kapton material available from E. I. DuPont de Nemours., Inc. (See U.S. Pat. No. 6,150,071 for a method of laminating Kapton material to form electrical interconnects, which is hereby incorporated in it entirety by reference.) Other alternative methods are also well known and will therefore not be described herein. The flex interconnect 60 couples to each of the circuit cards through the plurality of flex interconnect connectors and circuit card input/output connectors. Between each of the circuit card connectors, the flex interconnect 60 is preferably shaped in a serpentine manner, and the flex interconnect 60 may be heated and formed into the generally serpentine manner as illustrated in FIG. 2 to fit within the open space of box 10 as illustrated in FIG. 1. After connecting to circuit card 36, the flex interconnect 60 preferably turns down and bends ninety degrees (90°) and then serpentines along the bottom surface 22 of box 10 as seen more clearly in FIGS. 3 and 4. After several serpentine loops, flex interconnect cable 60 is broadened out and is held to bottom surface 22 of the box 11 by stress relief bar 70 and accompanying tie down assembly 80. Stress relief bar 70 assists both to hold flex interconnect 60 to bottom surface 22 while reducing the stress on the cable. The flex interconnect nut 60 next bends up to interconnect with the electrical connectors leading to the outside of box 10 as illustrated in FIGS. 3 and 4. The flex interconnect 60 is then shaped and held in place by rigid sections (82,84) while connecting to and mating with external connectors. The serpentine shape of flex interconnect 60 helps to relieve stress in the flex interconnect 60 and to insulate the flex interconnect 60 and each of the connections to the plurality of circuit cards from shocks that might otherwise compromise the integrity of the connection.

Input/output connectors (62,64,66,68) as illustrated in FIGS. 3 and 4, are mounted to respective circuit cards (36,38,40,42) and mate, in turn, with connectors (72,74,76,78) that are connected in spaced relation along the length of the flex interconnect 60. As illustrated in FIG. 3, the box 10 also includes shelf like members (25,27,29,31) upon which the circuit cards rest in addition to testing on the boss members and spacers previously mentioned. The circuit cards can be screwed or otherwise fastened to the shelf like members. By physically, and thus thermally, contacting the shelves as well as the sidewalls and end walls of the box 10, heat generated during operation of the circuit cards can be conducted away from the electronics on the cards. The external electrical connectors are fitted into connector rings (33,44,46,48,50,52) as previously described in this detailed description of the invention. As shown in FIG. 3, the box 10 may also have apertures formed or machined through selective sides thereof. These apertures among other things can help in dissipating heat away from the circuit cards during operation thereof.

Thus, what has been described above is a scheme for interconnecting circuit cards mounted within an electronics box to external connectors mounted in the walls of the electronic box. This novel scheme significantly reduces and preferably eliminates the need for a motherboard, which not only reduces the size requirement of the electronics box, but provides better heat sinking characteristics as well as better tolerances to shock and vibration. Improved heat sinking is achieved, in part, by contacting the circuit cards along a substantial portion of their periphery by the sides of the chassis box as well as the shelf members upon which the cards rest. Better tolerance to shock and vibration is achieved, in part, by securing the circuit cards to the shelves of the chassis box as well as to the bosses and spacers. In addition, the serpentine nature of the flex interconnect cable provides shock and stress relief. Use of the flex interconnect cable to connect and interconnect the circuit cards, instead of using a motherboard, allows the cards to be rigidly secured to the chassis box without regard for tolerances required between motherboard and chassis card guides. These characteristics are important in aerospace and space shuttle environments into which the electronics box may find applications. The scope of the present invention is intended to be limited only by the appended claims attached hereinafter.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An electronic chassis box including a pair of opposing sidewalls, a pair of opposing end walls, a bottom surface and a top cover comprising:
    a plurality of boss members formed therein extending five the bottom surface at respective heights to one another;
    a plurality of circuit cards each attached to respective ones of said plurality of said boss members such that said plurality of circuit cards are spatially related;
    a plurality of electrical connectors mounted to at least one of said pair of opposing sidewalls; and
    a flex interconnect interconnecting said plurality of circuit cards to one another and to said plurality of electrical connectors respectively.

2. The electronics chassis box of claim 1 wherein each one of said plurality of circuit cards comprises a respective input/output connector attached thereto through which electrical data may be transferred into and out of said plurality of circuit cards.

3. The electronic chassis box of claim 2 wherein said flex interconnect comprises a plurality of connectors spatially located along the length thereof, each one of said plurality of connectors corresponding to a respective one of said input/output connectors of said plurality of circuit cards.

4. The electronics chassis box of 1 wherein said flex interconnect comprises a serpentine portion.

5. An electronic chassis box including a pair of opposing sidewalls, a pair of opposing end walls, a bottom surface, and a top cover comprising:
    a plurality of boss members formed therein extending from the bottom surface at respective heights to one another;
    a plurality of circuit cards each attached to respective ones of said plurality of said boss members such that said plurality of circuit cards are spatially related;
    a plurality of electrical connectors mounted to at least one of said pair of opposing sidewalls;
    a flex interconnect comprising a serpentine portion interconnecting said plurality of circuit cards to one another and to said plurality of electrical connectors respectively; and
    a stress relief bar attached to said bottom surface of the electronic chassis box for reducing strain on said flex interconnect.

6. The electronics chassis box of claim 1 wherein said flex interconnect comprises a portion formed in serpentine loops and being made of Kapton material.

7. An electronics box machined from metal material comprising:
    first and second opposing end walls;
    first and second opposing side walls;
    a bottom surface;
    a top cover;
    a plurality of spacer members extending from said bottom surface;
    a plurality of circuit cards removably mounted on respective ones of said spacer members such that said circuit cards are spatially related;
    a plurality of electrical connectors mounted in at least one of said first and second opposing sidewalls; and
    a flex interconnect for connecting said circuit cards to one another and to said plurality of electrical connectors mounted in at least one of said first and second opposing sidewalls.

8. The electronics box of claim 7 wherein each of said plurality of circuit cards comprises a respective input/output connector attached thereto through which electrical data may be transferred into and out of each one of said plurality of circuit cards.

9. The electronics box of claim 8 wherein said flex interconnect comprises a plurality of connectors spaced along the length thereof, each one of said plurality of connectors being mated with a respective one of said input/output connectors attached to said plurality of circuit cards.

10. The electronics box of claim 9 wherein said flex interconnect further comprises a plurality of card connectors attached thereto and to said electrical connectors mounted in at least one of said first and second opposing sidewalls.

11. An electronics box machined from metal material comprising:
    first and second opposing end walls;
    first and second opposing side walls;
    a bottom surface;
    a top cover;
    a plurality of spacer members extending from said bottom surface;
    a plurality of circuit cards, having a respective input/output connector attached thereto through which electrical data may be transferred into and out of each one of said plurality of circuit cards, removably mounted on respective ones of said spacer members such that said circuit cards are spatially related;
    a plurality of electrical connectors mounted in at least one of said first and second opposing sidewalls;
    a flex interconnect comprising a plurality of connectors spaced along the length thereof, each one of said plurality of connectors being mated with a respective one of said input/output connectors attached to said plurality of circuit card a plurality of end connectors attached thereto and to said electrical connectors mounted in at least one of said first and second opposing sidewalls, wherein the flex interconnect connectors said circuit cards to one another and to said plurality of electrical connectors mounted in at least one of said first and second opposing sidewalls; and
    a stress relief bar attached to said bottom surface of electronic chassis box for reducing strain on said flex interconnect while holding said flex interconnect to said bottom surface.

12. The electronics chassis box of claim 11 wherein said flex interconnect comprises a portion formed in serpentine loops and being made of Kapton material.

13. The electronics chassis box of claim 12 further comprising apertures formed in selective end walls and sidewalls thereof.

14. An electronics box suited for application in the aerospace electrical data systems, the electronic box comprising:
   a pair of sidewalls;
   a pair of end walls;
   a bottom surface;
   a top cover;
   a plurality of spacer members extending from said bottom surface at specific heights above said bottom surface;
   a plurality of circuit cards mounted to respective ones of said plurality of spacer members such that said circuit cards are in a spatial relationship to one another;
   a plurality of input/output connectors each attached to and communicating with a corresponding respective one of said circuit cards;
   a plurality of output connectors mounted in at least one of said pair of sidewalls; and
   a flex interconnect electronically coupled to said plurality of input/output connectors and to said plurality of output connectors.

15. The electronics box of claim 14 wherein said flex interconnect further comprises a plurality of connectors spaced along the length thereof, each one of said plurality of connectors coupled to a respective one of said plurality of input/output connectors attached to said plurality of circuit cards.

16. The electronics box of claim 15 wherein said flex interconnect comprises Kapton material and comprises a generally serpentine shape looping between each one of said plurality of input/output connectors attached to said plurality of circuit cards.

17. An electronics box suited for application in the aerospace electrical data systems, the electronic box comprising:
   a pair of sidewalls;
   a pair of end walls,
   a bottom surface;
   a top cover;
   a plurality of spacer members extending from said bottom surface at specific heights above said bottom surface;
   a plurality of circuit cards mounted to respective ones of said plurality of space members such that said circuit cards are in a spatial relationship to one another;
   a plurality of input/output connectors each attached to and communicating with a corresponding respective one of said circuit cards;
   a plurality of output connectors mounted in at least one of said pair of sidewalls;
   a flex interconnect comprising Kapton material, electronically coupled to said plurality of input/output connectors and to said plurality of output connectors, the flex interconnect having a generally serpentine shape looping between each one of said plurality of input/output connectors attached to said plurality of circuit cards and a plurality of connectors spaced along the length thereof; each one of said plurality of connectors coupled to a respective one of said plurality of input/output connectors attached to plurality of circuit cards; and
   a stress relief member which both holds a portion of said flex interconnect to said bottom surface and relieves stress on said flex interconnect.

18. An electronics box suited for application in the aerospace electrical data systems, the electronic box comprising:
   a pair of sidewalls;
   a pair of end walls;
   a bottom surface;
   a top cover
   a plurality of spacer members extending from said bottom surface at specific heights above said bottom surface;
   a plurality of circuit cards mounted to respective ones of said plurality of spacer members such that said circuit cards are in a spatial relationship to one another;
   a plurality of input/output connectors each attached to and communicating with a corresponding respective one of said circuit cards;
   a plurality of output connectors mounted in at least one of said pair of sidewalls;
   a flex interconnect electronically coupled to said plurality of input/output connectors and to said plurality of output connectors; and
   a plurality of shelves machined from at least one of said pair of sidewalls and said pair of end walls each of said shelves configured for supporting one of said plurality of circuit cards.

19. The electronics box of claim 18 wherein said pair of sidewalls, said pair of end walls, and said bottom surface arm machined from a single piece of metal stock.

20. The electronics box of claim 19 wherein each of said plurality of circuit cards are in thermal contact with said end walls, said sidewalls, and one of said plurality of shelves.

* * * * *